United States Patent
Miyake

(10) Patent No.: US 12,130,008 B2
(45) Date of Patent: Oct. 29, 2024

(54) LIGHT EMISSION DEVICE AND ILLUMINATION APPARATUS

(71) Applicant: KYOCERA Corporation, Kyoto (JP)

(72) Inventor: Akira Miyake, Omihachiman (JP)

(73) Assignee: KYOCERA Corporation, Kyoto (JP)

( * ) Notice: Subject to any disclaimer, the term of this patent is extended or adjusted under 35 U.S.C. 154(b) by 0 days.

(21) Appl. No.: 18/038,451

(22) PCT Filed: Nov. 25, 2021

(86) PCT No.: PCT/JP2021/043284
§ 371 (c)(1),
(2) Date: May 24, 2023

(87) PCT Pub. No.: WO2022/114086
PCT Pub. Date: Jun. 2, 2022

(65) Prior Publication Data
US 2024/0011621 A1    Jan. 11, 2024

(30) Foreign Application Priority Data
Nov. 27, 2020    (JP) .................................. 2020-196995

(51) Int. Cl.
*F21V 9/30*    (2018.01)
*F21S 4/28*    (2016.01)

(52) U.S. Cl.
CPC . *F21V 9/30* (2018.02); *F21S 4/28* (2016.01)

(58) Field of Classification Search
CPC ...... F21V 9/30; F21S 4/28; F21K 9/60; F21Y 2115/10; H01L 33/502; H01L 33/505; H01L 33/60; H01L 33/50
See application file for complete search history.

(56) References Cited

U.S. PATENT DOCUMENTS 8,981,392 B2 *   3/2015   Song ................... H01L 25/0753
                                                    257/E33.059
2015/0053993 A1    2/2015  Ono

FOREIGN PATENT DOCUMENTS

JP    2004-228531 A    8/2004
JP    2007-123481 A    5/2007
(Continued)

OTHER PUBLICATIONS

WO 2012090350, Matsuda et al, May 7, 2012, English Translation (Year: 2012).*

(Continued)

*Primary Examiner* — Peggy A Neils
(74) *Attorney, Agent, or Firm* — Volpe Koenig

(57) ABSTRACT

A light emission device includes a substrate, a light emission element, and a wavelength converter. The substrate has a first surface. The light emission element is mounted on the first surface and emits excitation light. The wavelength converter is positioned on at least a portion of the first surface and the light emission element. The wavelength converter converts the excitation light into illumination light. The substrate includes at least one of a recess or a projection. The recess has a second surface and a third surface. The second surface is positioned below the first surface. The third surface connects the second surface and the first surface to each other. The projection projects upward from the first surface. The wavelength converter is in contact with at least one of at least a portion of the second surface or at least a portion of the projection.

12 Claims, 12 Drawing Sheets

(56) References Cited

FOREIGN PATENT DOCUMENTS

| | | | |
|---|---|---|---|
| JP | 2008-047617 A | 2/2008 | |
| JP | 2008-147270 A | 6/2008 | |
| JP | 2008277349 A | 11/2008 | |
| JP | 2015-041722 A | 3/2015 | |
| JP | 2015233060 A | 12/2015 | |
| JP | 2019-117729 A | 7/2019 | |
| KR | 10-1346706 | * 12/2013 | ............. H01L 33/60 |
| WO | WO 2012090350 | * 7/2012 | .......... F21Y 2115/10 |

OTHER PUBLICATIONS

KR 10-1346706, Dec. 31, 2013, Baek, English Translation (Year: 2013).*

* cited by examiner

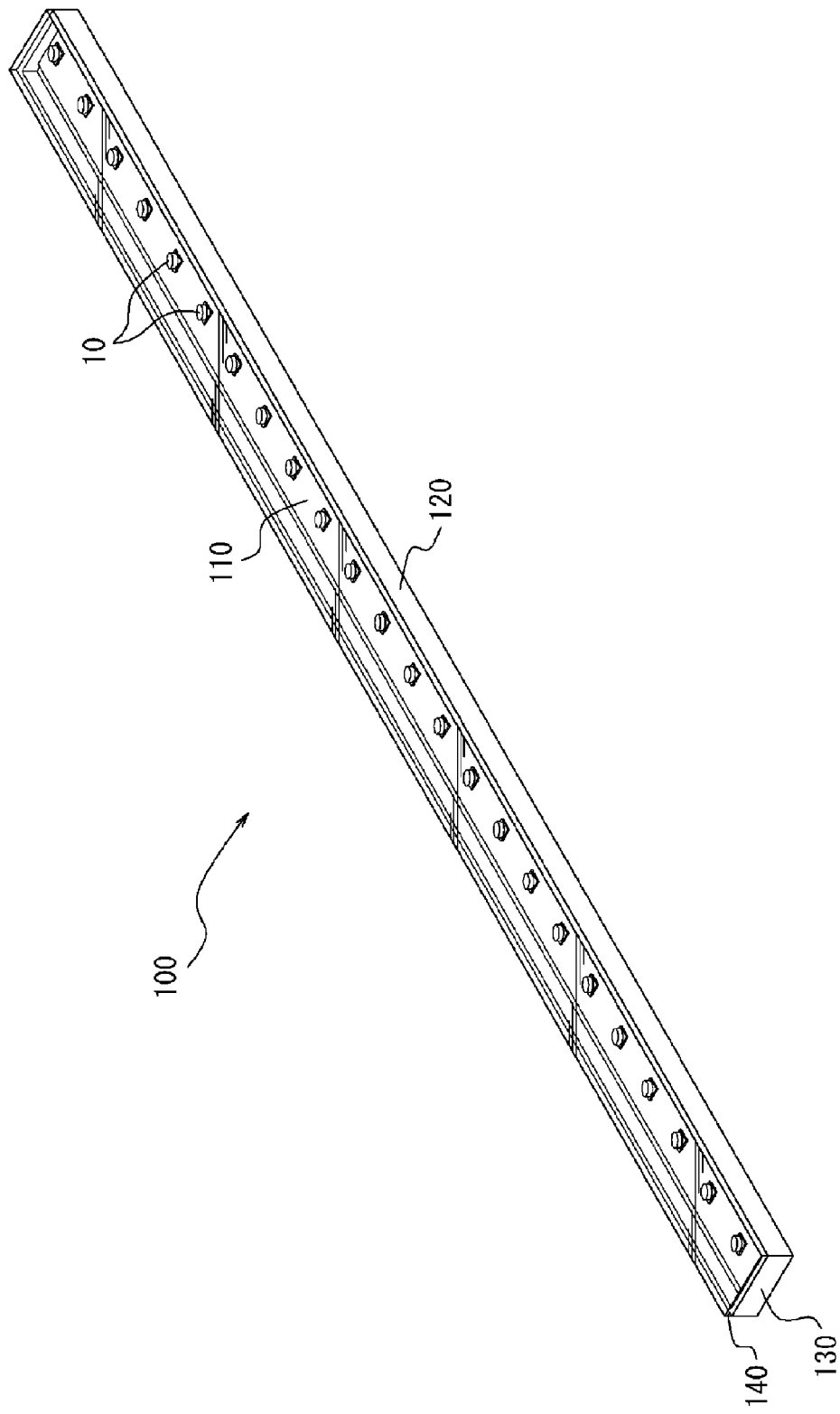

LIGHT EMISSION DEVICE AND ILLUMINATION APPARATUS

CROSS-REFERENCE TO RELATED APPLICATIONS

The present application claims priority from Japanese Patent Application No. 2020-196995 (filed on Nov. 27, 2020), the entire contents of which are incorporated herein by reference.

TECHNICAL FIELD

The present disclosure relates to a light emission device and an illumination apparatus.

BACKGROUND OF INVENTION

A known light emission device includes a light emission element positioned in a space surrounded by a frame. The frame is filled with resin to seal the light emission element (see, for example, Patent Literature 1).

CITATION LIST

Patent Literature

Patent Literature 1: Japanese Unexamined Patent Application Publication No. 2019-117729

SUMMARY

In one embodiment of the present disclosure, a light emission device includes a substrate, a light emission element, and a wavelength converter 6. The substrate has a first surface. The light emission element is mounted on the first surface and emits excitation light. The wavelength converter is positioned on at least a portion of the first surface and the light emission element. The wavelength converter converts the excitation light into illumination light. The substrate includes at least one of a recess or a projection. The recess has a second surface and a third surface. The second surface is positioned below the first surface. The third surface connects the second surface and the first surface to each other. The projection projects upward from the first surface. The wavelength converter is in contact with at least one of at least a portion of the second surface or at least a portion of the projection.

In one embodiment of the present disclosure, an illumination apparatus includes the light emission device and a mount board. The light emission device is mounted on the mount board.

BRIEF DESCRIPTION OF THE DRAWINGS

FIG. 12 is a perspective view illustrating an example of the structure of an illumination apparatus according to an embodiment.

DESCRIPTION OF EMBODIMENTS

Example of Structure of Light Emission Device 10

Figure 1:
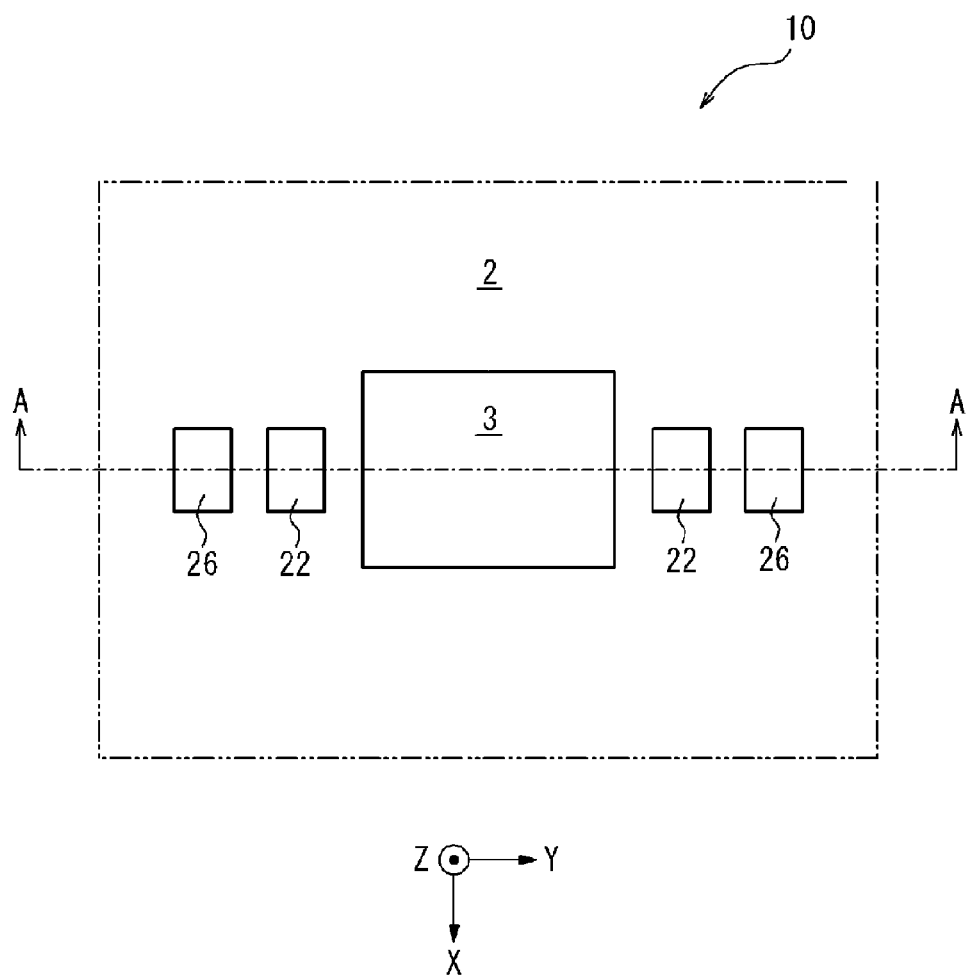
FIG. 1 is a plan view illustrating an example of the structure of a light emission device according to an embodiment.
Figure 2:
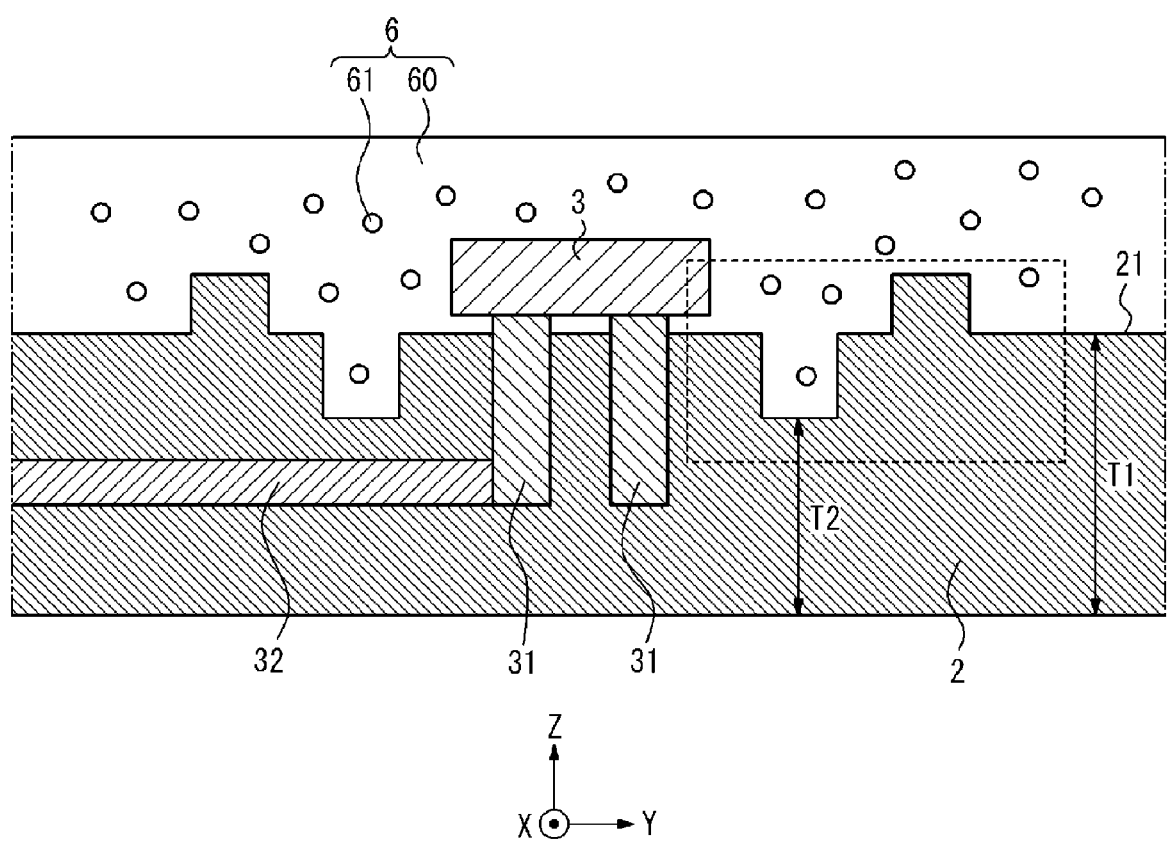
FIG. 2 is a sectional view of FIG. 1 taken along line A-A.
Figure 3:
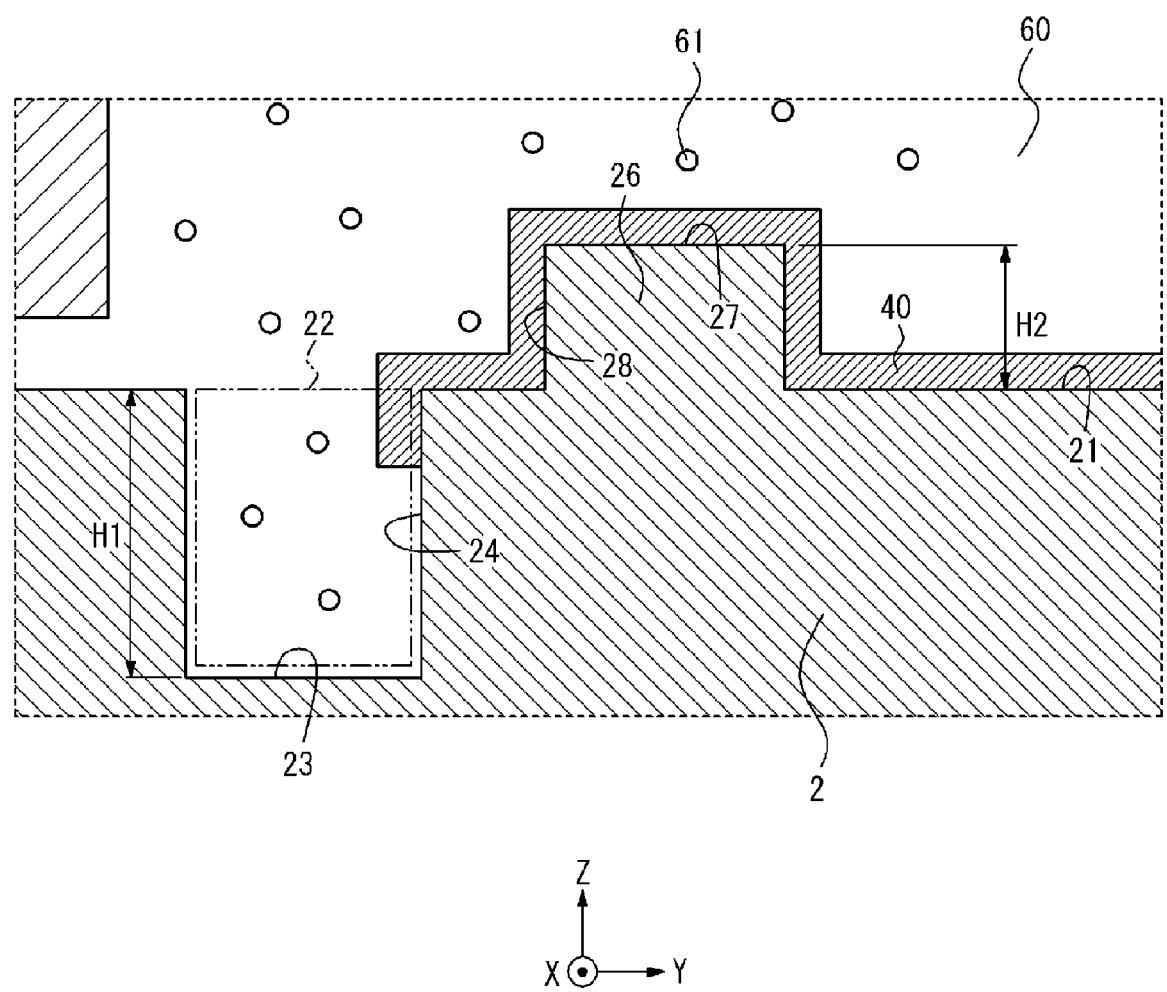
FIG. 3 is an enlarged view of a region surrounded by the dashed line in FIG. 2.

As illustrated in FIGS. 1, 2, and 3, the light emission device 10 includes an element substrate 2, a light emission element 3, and a wavelength converter 6. The element substrate 2 has a first surface 21 and includes recesses 22 and projections 26. The light emission element 3 is mounted on the first surface 21 of the element substrate 2. The wavelength converter 6 is positioned above the light emission element 3 and above the first surface 21 of the element substrate 2. The wavelength converter 6 covers upper and side surfaces of the light emission element 3. The wavelength converter 6 converts light emitted by the light emission element 3 into light having a wavelength different from a wavelength of the light emitted by the light emission element 3. The light emission device 10 emits the light converted by the wavelength converter 6. In FIG. 1 and other figures, an upward direction relative to the light emission device 10 corresponds to a positive Z-axis direction.

The light emission element 3 emits light having a peak wavelength in a wavelength range of 360 nm or more and 430 nm or less. The wavelength range of 360 nm or more and 430 nm or less is also referred to as a violet light range.

The light emitted from the light emission element 3 enters the wavelength converter 6. The wavelength converter 6 converts the incoming light into light having a peak wavelength in a wavelength range of 360 nm or more and 780 nm or less, and emits the converted light. The wavelength range of 360 nm or more and 950 nm or less is also referred to as a visible light range. The visible light range includes the violet light range. Visible light includes violet light. The wavelength converter 6 is excited by the light from the light emission element 3, and thereby emits light with a peak wavelength range in the visible light range. The light emitted by the light emission element 3 is also referred to as excitation light. The light emission element 3 included in the light emission device 10 is also referred to as an excitation-light emission element.

The components of the light emission device 10 will now be described.

The element substrate 2 is also referred to simply as a substrate. The element substrate 2 may be made of, for example, an insulative material. The element substrate 2 may be made of, for example, a ceramic material, such as aluminum oxide (alumina) or mullite, a glass ceramic material, or a composite material of more than one of these materials. The element substrate 2 may be made of, for example, a polymeric resin material in which fine particles of a metal oxide enabling adjustment of thermal expansion are dispersed. The element substrate 2 may include aluminum nitride or silicon carbide. Accordingly, the element substrate 2 can have an increased thermal conductivity, and the light emission device 10 can have an improved heat dissipation performance.

The element substrate 2 has the first surface 21 facing in the positive Z-axis direction. The light emission element 3 is mounted on the first surface 21 of the element substrate 2. The element substrate 2 includes first wiring lines 31 and second wiring lines 32 for supplying power to the light emission element 3. The first wiring lines 31 extend in a direction crossing the first surface 21, and are exposed in plan view of the first surface 21. The first wiring lines 31 may be flush with the first surface 21, or project upward from the first surface 21. The first wiring lines 31 are also referred to as via wiring lines. The second wiring lines 32 extend in a direction along the first surface 21. The first wiring lines 31 may extend to a surface of the element substrate 2 facing in a negative Z-axis direction (also referred to as a back surface). In this case, the second wiring lines 32 may be positioned on the back surface of the element substrate 2. The second wiring lines 32 may be positioned both on the back surface of the element substrate 2 and in the element substrate 2. The first wiring lines 31 and the second wiring lines 32 may be made of a conductive material, such as tungsten, molybdenum, manganese, or copper. The first wiring lines 31 and the second wiring lines 32 may be formed by, for example, preparing metal paste by adding an organic solvent to tungsten powder, printing the metal paste on ceramic green sheets used to form the element substrate 2 in a predetermined pattern, and stacking and firing the ceramic green sheets. Each of the first wiring lines 31 and the second wiring lines 32 may include a plating layer of nickel, gold, or the like formed on a surface thereof to suppress oxidation. The first wiring lines 31 and the second wiring lines 32 are also referred to as power-feed wiring lines.

The element substrate 2 further includes a reflective film 40 on the first surface 21. The reflective film 40 is positioned on the first surface 21 to cover at least a portion of the first surface 21. The reflective film 40 may be made of a material obtained by, for example, adding a white material, such as titanium oxide, to a silicone-resin-based material. The reflective film 40 is not limited to this example, and may be formed to have a reflectance higher than the reflectance of the first surface 21. When the reflective film 40 is positioned on the first surface 21, the first surface 21 does not easily absorb the excitation light emitted from the light emission element 3 and the illumination light obtained by the wavelength converter 6. As a result, the excitation light and the illumination light can be efficiently emitted to the outside of the light emission device 10.

The first surface 21 of the element substrate 2 includes the recesses 22. Each recess 22 is a space defined by a second surface 23 and a third surface 24. The recess 22 includes an opening at the same height as the height of the first surface 21, and communicates with a space above the recess 22 through the opening. The recess 22 may include at least one hole portion.

The second surface 23 extends in a direction along the first surface 21 and is positioned deeper into the element substrate 2 than the first surface 21. In other words, the second surface 23 is positioned below the first surface 21.

The third surface 24 connects the first surface 21 and the second surface 23 to each other and extends in a direction crossing the first surface 21 and the second surface 23. When, for example, the recess 22 is rectangular in plan view, the recess 22 may include more than one third surfaces 24. When the recess 22 is circular in plan view, the third surface 24 may be cylindrical.

The reflective film 40 may at least partially cover a portion of the third surface 24 of the recess 22, the portion facing the light emission element 3. The reflective film 40 may cover the third surface 24 of the recess 22 over an area connected to a portion of the second surface 23. When the reflective film 40 covers the third surface 24 of the recess 22, the excitation light or the illumination light entering the recess 22 is reflected toward a region above the element substrate 2 and is not easily absorbed by the recess 22.

The wavelength converter 6 extends into at least a portion of the recess 22. The wavelength converter 6 is in contact with at least a portion of the second surface 23. When the wavelength converter 6 extends into the recess 22 and is in contact with at least a portion of the second surface 23, the element substrate 2 and the wavelength converter 6 can be in contact with each other over a large area. As a result, the wavelength converter 6 can more strongly adhere to the element substrate 2. In other words, the wavelength converter 6 is not easily removed from the element substrate 2. When the wavelength converter 6 is in contact with at least a portion of the third surface 24 of the recess 22, the wavelength converter 6 can be in contact with the element substrate 2 in at least two directions. As a result, the wavelength converter 6 is not easily removed from the element substrate 2 even when the wavelength converter 6 receives an external force.

The wavelength converter 6 is in direct contact with at least a portion of the second surface 23. In other words, the wavelength converter 6 is in contact with at least a portion of the second surface 23 without the reflective film 40 being disposed therebetween. The wavelength converter 6 generates heat upon conversion of the excitation light into the illumination light. The generated heat is transmitted to the element substrate 2 and dissipated toward the back surface (surface in the negative Z-axis direction) of the element substrate 2. The thickness of the element substrate 2 at the first surface 21 is denoted by T1. The thickness is the size of the element substrate 2 in the Z-axis direction. The thickness of the element substrate 2 at the second surface 23 is denoted by T2. Since T2 is less than T1, the second surface 23 is closer to the back surface than the first surface 21. Since the second surface 23 is closer to the back surface than the first surface 21, the thermal resistance between the second surface 23 and the back surface is less than the thermal resistance between the first surface 21 and the back surface. As a result, the amount of heat dissipated from the wavelength converter 6 extending to the second surface 23 to the back surface through the second surface 23 may be greater than the amount of heat dissipated from the wavelength converter 6 positioned on the first surface 21 to the back surface through the first surface 21. In other words, when the wavelength converter 6 is in contact with the second surface 23, heat can be more easily dissipated from the wavelength converter 6.

Assume that the thermal conductivity of the reflective film 40 is less than the thermal conductivities of the element substrate 2 and the wavelength converter 6. In this case, the amount of heat dissipated directly from the wavelength converter 6 to the element substrate 2 without the reflective film 40 being disposed therebetween is greater than the amount of heat dissipated from the wavelength converter 6 to the element substrate 2 through the reflective film 40. Therefore, when the wavelength converter 6 is in connect with at least a portion of the second surface 23 without the reflective film 40 being disposed therebetween, heat can be more easily dissipated from the wavelength converter 6.

The depth of the recess 22 in the element substrate 2 may be less than the thickness of the element substrate 2 at the second surface 23. In other words, the distance between the first surface 21 and the second surface 23 of the element substrate 2 may be less than the thickness of the element substrate 2 at the second surface 23. In this case, the thickness of the element substrate 2 at the recess 22 is equal to or greater than half the thickness of the element substrate 2 at other portions. As a result, the reduction in the thickness of the element substrate 2 due to the recess 22 does not easily affect the strength of the element substrate 2.

The first surface 21 of the element substrate 2 includes the projections 26 projecting upward from the first surface 21. Each projection 26 includes a fourth surface 27 and a fifth surface 28. The fourth surface 27 extends in a direction along the first surface 21 and is further away from the element substrate 2 than the first surface 21. The fifth surface 28 extends in a direction crossing the first surface 21 and the fourth surface 27 to connect the first surface 21 and the fourth surface 27 to each other. A top portion (upper surface) of the projection 26 is not necessarily flat. The top portion (upper surface) of the projection 26 may be a curved surface. The top portion of the projection 26 may include an inclined surface in a region close to the light emission element 3. In such a case, light can be more efficiently emitted in an upward direction.

The wavelength converter 6 is in contact with at least a portion of the projection 26. When the wavelength converter 6 is in contact with the projection 26, the element substrate 2 and the wavelength converter 6 can be in contact with each other over a large area. As a result, the wavelength converter 6 can more strongly adhere to the element substrate 2. In other words, the wavelength converter 6 is not easily removed from the element substrate 2. The wavelength converter 6 is in contact with at least a portion of the fifth surface 28 of the projection 26. When the wavelength converter 6 is in contact with at least a portion of the fifth surface 28 of the projection 26, the wavelength converter 6 can be in contact with the element substrate 2 in at least two directions. As a result, the wavelength converter 6 is not easily removed from the element substrate 2 even when the wavelength converter 6 receives an external force.

The reflective film 40 may cover at least a portion of the fifth surface 28 of the projection 26, the portion being positioned at a side adjacent to the light emission element 3. When the reflective film 40 covers at least a portion of the fifth surface 28 of the projection 26 positioned at a side adjacent to the light emission element 3, the excitation light or the illumination light reaching the projection 26 is reflected toward a region above the element substrate 2 and is not easily absorbed by the projection 26. When the fifth surface 28 of the projection 26 reflects the excitation light or the illumination light, the excitation light emitted from a side surface of the light emission element 3 and the illumination light into which the excitation light is converted more easily travel upward than when the projection 26 is not provided. As a result, light can be more efficiently emitted in an upward direction.

Referring to FIG. 3, the depth of the recess 22 from the first surface 21, that is, the distance from the first surface 21 to the second surface 22, is denoted by H1. The height of the projection 26 from the first surface 21, that is, the distance from the first surface 21 to the top portion of the projection 26, is denoted by H2. H2 is less than H1. In this case, light traveling from the light emission element 3 toward the first surface 21 of the element substrate 2 does not easily enter the projection 26. In other words, emission of the excitation light or the illumination light from the sides of the light emission device 10 can be reduced. As a result, light can be more efficiently emitted over a wide angle range.

The projection 26 may be positioned farther from the light emission element 3 than the recess 22. When more than one recesses 22 and more than one projections 26 are provided, the projection 26 closest to the light emission element 3 may be positioned farther from the light emission element 3 than the recess 22 closest to the light emission element 3. The recesses 22 and the projections 26 may be arranged along concentric circles with the light emission element 3 at the center. In this case, the projections 26 are positioned far from the light emission element 3, and therefore do not easily absorb the excitation light or the illumination light. As a result, light can be more efficiently emitted.

In the present embodiment, the light emission element 3 is a light emission diode (LED). The LED emits light to the outside as a result of recombination of electrons and holes in a PN junction between a P-type semiconductor and an N-type semiconductor. The light emission element 3 is not limited to an LED, and may be other light-emitting devices.

The light emission element 3 is mounted on the first surface 21 of the element substrate 2. The light emission element 3 is electrically connected to the first wiring lines 31 with a brazing material, solder, or the like on the first surface 21 of the element substrate 2. Two first wiring lines 31 are provided as a pair so that each first wiring line 31 is connected to one of positive and negative electrodes of the light emission element 3. The light emission element 3 is positioned on the first wiring lines 31 to cover at least portions of the first wiring lines 31 in see-through plan view of the first surface 21 of the element substrate 2. The light emission element 3 may be larger than the first wiring lines 31 in see-through plan view.

The light emission element 3 may be mounted on the element substrate 2 by flip-chip connection. When the light emission element 3 is mounted by flip-chip connection, the first wiring lines 31 and the brazing material, solder, or the like are covered by the light emission element 3 in plan view of the first surface 21. When the first wiring lines 31 and the brazing material, solder, or the like are covered by the light emission element 3, the first wiring lines 31 and the brazing material, solder, or the like do not easily receive the excitation light emitted by the light emission element 3 or the illumination light obtained by the wavelength converter 6. Therefore, the first wiring lines 31 and the brazing material, solder, or the like do not easily absorb the excitation light or the illumination light. As a result, the light emission device 10 can more efficiently emit light.

In a comparative example, the light emission element 3 is mounted on the element substrate 2 by wire bonding. In such a case, a wire includes at least a portion that is not covered by the light emission element 3. In this case, the wire may absorb the excitation light or the illumination light. In the present embodiment, the light emission device 10 includes the light emission element 3 mounted on the element substrate 2 by flip-chip connection. Therefore, absorption of the excitation light or the illumination light is reduced compared to when the light emission element 3 is mounted by wire bonding as in the comparative example. As a result, the light emission device 10 can more efficiently emit light.

The number of light emission elements 3 mounted on the first surface 21 of the element substrate 2 is one in FIG. 1 and other figures. However, the number of light emission elements 3 is not particularly limited, and may be two or more. When the number of light emission elements 3 is two or more, the light emission elements 3 are positioned so as not to overlap in plan view of the first surface 21.

The light emission element 3 may include a light-transmissive base and an optical semiconductor layer formed on the light-transmissive base. The light-transmissive base may include a material on which an optical semiconductor layer can be grown by a chemical vapor deposition method, such as a metal-organic chemical vapor deposition method or a molecular beam epitaxy method. The light-transmissive base may be made of, for example, sapphire, gallium nitride, aluminum nitride, zinc oxide, zinc selenide, silicon carbide, silicon (Si), or zirconium diboride. The light-transmissive base may have a thickness of, for example, 50 µm or more and 1000 µm or less.

The optical semiconductor layer may include a first semiconductor layer formed on the light-transmissive base, a light emission layer formed on the first semiconductor layer, and a second semiconductor layer formed on the light emission layer. The first semiconductor layer, the light emission layer, and the second semiconductor layer may be formed of, for example, a Group III nitride semiconductor, a Group III-V semiconductor, such as gallium phosphide or gallium arsenide, or a Group III nitride semiconductor, such as gallium nitride, aluminum nitride, or indium nitride.

The first semiconductor layer may have a thickness of, for example, 1 µm or more and 5 µm or less. The light emission layer may have a thickness of, for example, 25 nm or more and 150 nm or less. The second semiconductor layer may have a thickness of, for example, 50 nm or more and 600 nm or less.

The wavelength converter 6 is positioned on the first surface 21 of the element substrate 2. The wavelength converter 6 fills the space above the light emission element 3 to seal the light emission element 3. The wavelength converter 6 may be formed by applying a paste on the first surface 21 of the element substrate 2 and then curing the paste. Alternatively, the wavelength converter 6 may be formed by placing a sheet on the first surface 21 of the element substrate 2 and then curing the sheet.

The excitation light emitted from the light emission element 3 directly enters the wavelength converter 6. The wavelength converter 6 converts the incoming excitation light, which is violet light, into light having a peak wavelength in a wavelength range of 360 nm or more and 780 nm or less, and emits the converted light.

The wavelength converter 6 may include a light-transmissive member 60 that transmits light and phosphor elements 61.

The light-transmissive member 60 may be made of, for example, an insulative resin material, such as fluorocarbon resin, silicone resin, acrylic resin, or epoxy resin, that transmits light or a glass material that transmits light. The light-transmissive member 60 may have a refractive index of, for example, 1.4 or more and 1.6 or less.

The light-transmissive member 60 contains the phosphor elements 61. The phosphor elements 61 may be substantially evenly dispersed in the light-transmissive member 60. The phosphor elements 61 convert the incoming violet light into light with various peak wavelengths.

The phosphor elements 61 may convert the violet light into, for example, light specified by a spectrum with a peak wavelength in a wavelength range from 400 nm to 500 nm, that is, blue light. In this case, the phosphor elements 61 may contain a material such as $BaMgAl_{10}O_{17}$:Eu, $(Sr,Ca,Ba)_{10}(PO_4)_6Cl_2$:Eu, or $(Sr,Ba)_{10}(PO_4)_6Cl_2$:Eu.

The phosphor elements 61 may convert the violet light into, for example, light specified by a spectrum with a peak wavelength in a wavelength range from 450 nm to 550 nm, that is, blue green light. In this case, the phosphor elements 61 may contain a material such as $(Sr,Ba,Ca)_5(PO_4)_3Cl$:Eu or $Sr_4Al_{14}O_{25}$:Eu.

The phosphor elements 61 may convert the violet light into, for example, light specified by a spectrum with a peak wavelength in a wavelength range from 500 nm to 600 nm, that is, green light. In this case, the phosphor elements 61 may contain a material such as $SrSi_2(O,Cl)_2N_2$:Eu, $(Sr,Ba,Mg)_2SiO_4$:Eu$^{2+}$, ZnS:Cu,Al, or $Zn_2SiO_4$:Mn.

The phosphor elements 61 may convert the violet light into, for example, light specified by a spectrum with a peak wavelength in a wavelength range from 600 nm to 700 nm, that is, red light. In this case, the phosphor elements 61 may contain a material such as $Y_2O_2S$:Eu, $Y_2O_3$:Eu, $SrCaClAlSiN_3$:Eu$^{2+}$, $CaAlSiN_3$:Eu, or $CaAlSi(ON)_3$:Eu.

The phosphor elements 61 may convert the violet light into, for example, light specified by a spectrum with a peak wavelength in a wavelength range from 680 nm to 800 nm, that is, near-infrared light. The near-infrared light may include light with a wavelength range from 680 nm to 2500 nm. In this case, the phosphor elements 61 may contain a material such as $3Ga_5O_{12}$:Cr.

The combination of the types of the phosphor elements 61 included in the wavelength converter 6 is not particularly limited. The material contained in the phosphor elements 61 is not limited to the above-described materials, and various other materials may be contained.

As described above, the phosphor elements 61 convert the violet light entering the wavelength converter 6 from the light emission element 3 into light with a peak wavelength different from that of the violet light. The peak wavelength of the converted light may be included in a visible light range. The converted light may have a plurality of peak wavelengths depending on the combination of the phosphor elements 61 included in the wavelength converter 6. For example, when the phosphor elements 61 contain a material emitting blue fluorescent light, a material emitting blue green fluorescent light, and a material emitting green fluorescent light, the converted light has wavelengths of blue, blue green, and green as peak wavelengths. When the phosphor elements 61 contain only one type of material, the converted light has a peak wavelength of that material. The phosphor elements 61 are not limited to these examples, and may contain materials in various combinations. The color of light emitted from the wavelength converter 6 is determined on the basis of the types of materials contained in the phosphor elements 61. In other words, the converted light may have various spectra.

In the present embodiment, the light emission device 10 is capable of emitting light having various spectra depending on the combination of the materials contained in the phosphor elements 61. For example, the light emission device 10 is capable of emitting light with a spectrum of direct light from the sun, a spectrum of sunlight that has reached a predetermined depth in the sea, a spectrum of candlelight, a spectrum of light of a firefly, or the like. In other words, the light emission device 10 is capable of emitting light in various colors. The light emission device 10 is capable of emitting light at various color temperatures.

As described above, in the present embodiment, the light emission device 10 includes the element substrate 2 including at least one of the recess 22 or the projection 26 positioned on the first surface 21. The wavelength converter 6 is in contact with at least one of at least a portion of the second surface 23 or at least a portion of the projection 26. Thus, the wavelength converter 6 is not easily removed from the element substrate 2. The wavelength converter 6 is simply placed on the element substrate 2 and is not easily removed from the element substrate 2. As a result, in the present embodiment, the light emission device 10 includes a simple structure, and the reliability thereof can be maintained or improved. When the element substrate 2 includes both the recess 22 and the projection 26, the possibility of removal of the wavelength converter 6 can be further reduced. When at least one of the recess 22 or the projection 26 is positioned on the first surface 21, the light emission device 10 can more efficiently emit light.

Other Embodiments of Light Emission Device 10

Figure 4:
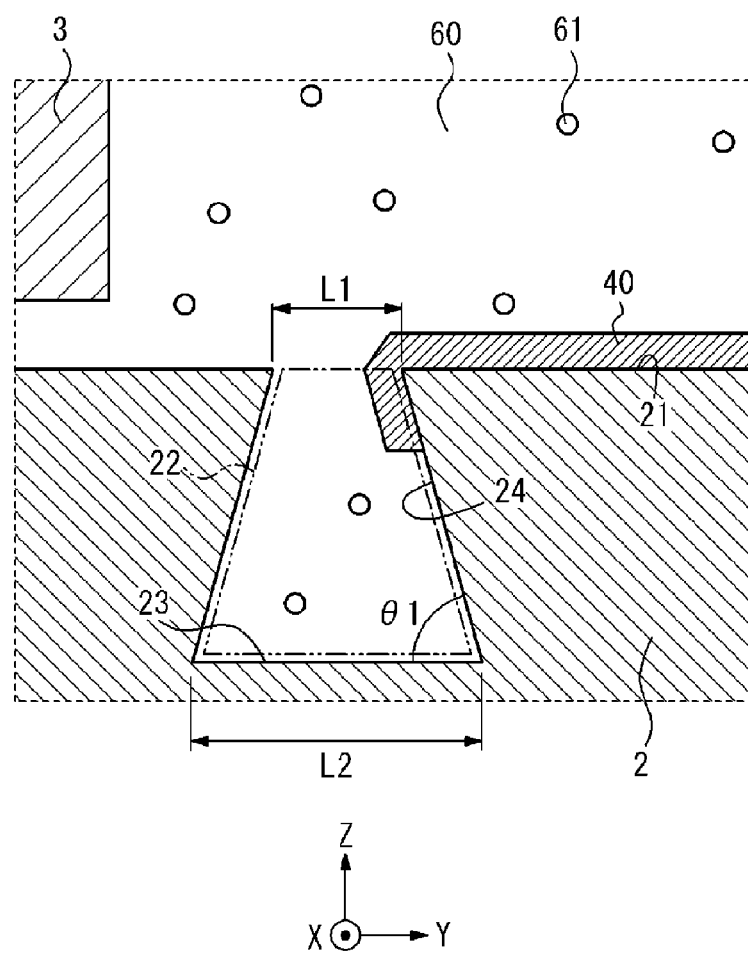
FIG. 4 is a sectional view illustrating an example in which a recess includes a second surface having an inverse-tapered shape.

The area of the opening of the recess 22 may be less than the area of the second surface 23. For example, as illustrated in FIG. 4, a length (L1) of the opening of the recess 22 in sectional view may be shorter than a length (L2) of the second surface 23 in sectional view. In plan view of the element substrate 2, an edge of the opening of the recess 22 may be positioned inside an edge of the second surface 23. An angle (θ1) between the second surface 23 and the third surface 24 defining the recess 22 may be acute. The shape illustrated in FIG. 4 is also referred to as an inverse-tapered shape.

Figure 5:
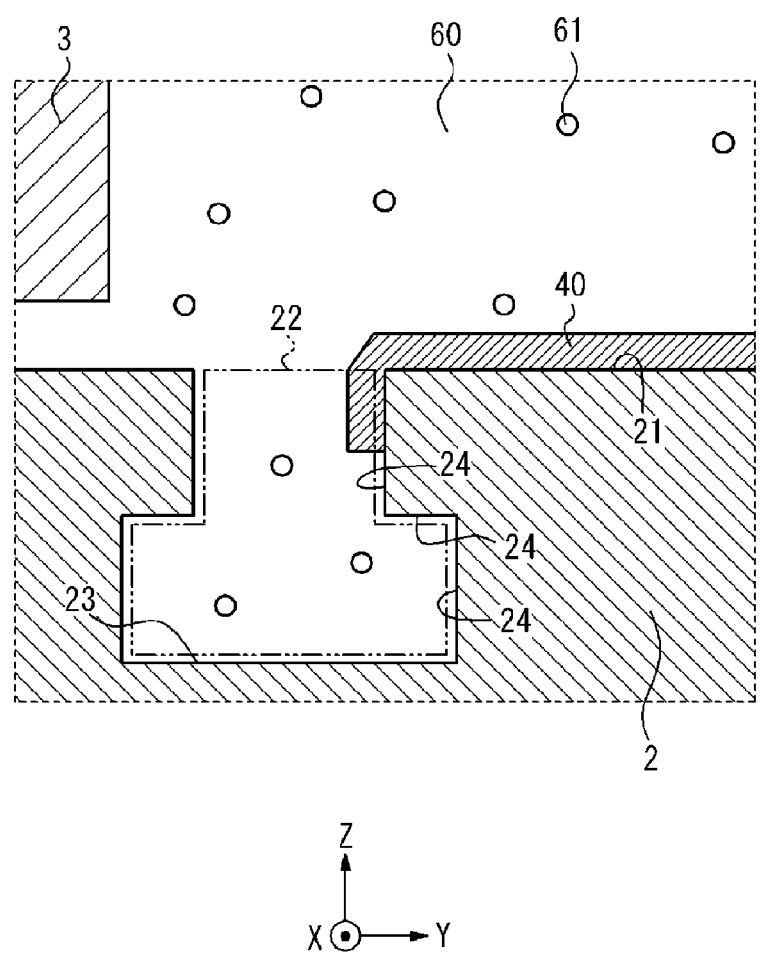
FIG. 5 is a sectional view illustrating an example in which the recess includes a lower portion having a cavity shape.

As illustrated in FIG. 5, the recess 22 may include at least two sections in sectional view. The recess 22 may include an upper section (section closer to the first surface 21) and a lower section (section farther from the first surface 21). The area of the lower section may be smaller than the area of the upper section in plan view of the element substrate 2. The shape illustrated in FIG. 5 is also referred to as a cavity shape.

When the wavelength converter 6 is disposed in the recess 22 including one of the structures illustrated in FIGS. 4 and 5, the wavelength converter 6 is not easily removed from the first surface 21 of the element substrate 2. In other words, the wavelength converter 6 can more strongly adhere to the element substrate 2. The space in the recess 22 may have a cross-sectional area less than that of the second surface 23 at least at a location between the first surface 21 and the second surface 23 in the height direction. In other words, the space in the recess 22 may have a constricted shape in sectional view. Also in this case, the wavelength converter 6 is not easily removed from the first surface 21 of the element substrate 2.

Figure 6:
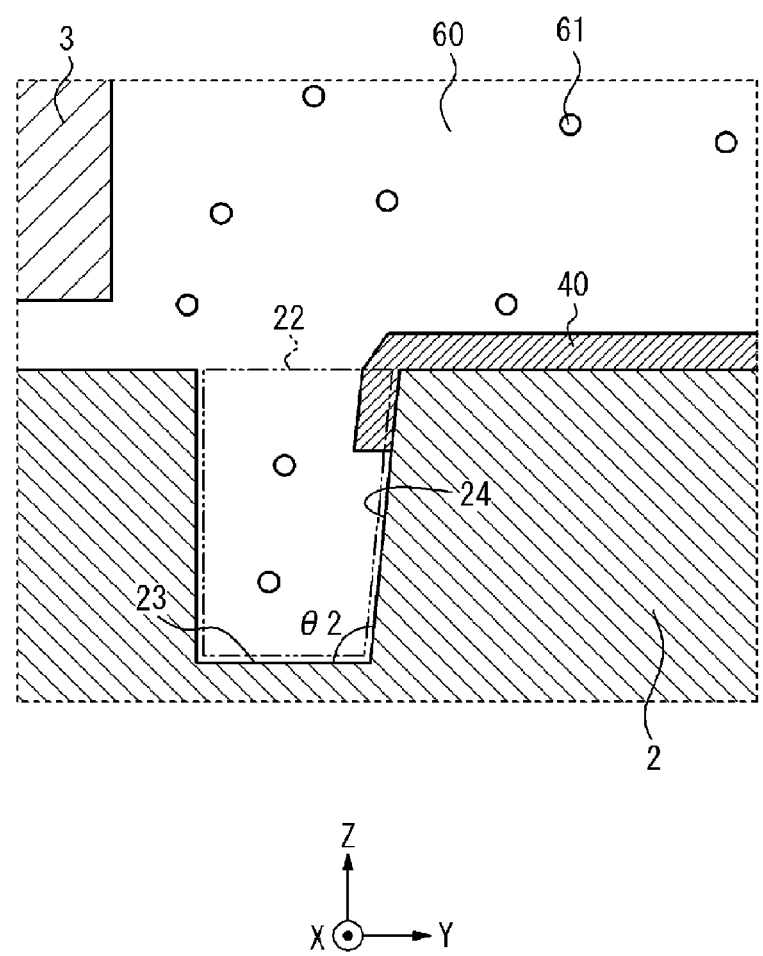
FIG. 6 is a sectional view illustrating an angle between the second surface and a third surface of the recess.

As illustrated in FIG. 6, the recess 22 may be structured such that an angle (θ2) between the third surface 24 positioned at a side far from the light emission element 3 (side in the positive Y-axis direction in FIG. 6) and the second surface 23 is obtuse. When the recess 22 is rectangular in plan view, the third surface 24 at the side far from the light emission element 3 is one of multiple third surfaces 24 facing the third surface 24 connected to the light emission element 3 in sectional view. When the recess 22 is circular in plan view, the third surface 24 at the side far from the light emission element 3 is the third surface 24 in a region facing a region connected to the light emission element 3. When the excitation light or the illumination light enters the recess 22 including the structure illustrated in FIG. 6 from the light emission element 3, the entering light is reflected by the third surface 24. Since the angle (θ2) between the third surface 24 at the side far from the light emission element 3 and the second surface 23 is obtuse, the light entering in a direction from the light emission element 3 is easily reflected upward. As a result, the light emission device 10 can emit a greater amount of light to the outside. In other words, the light emission device 10 can more efficiently emit light.

Figure 7:
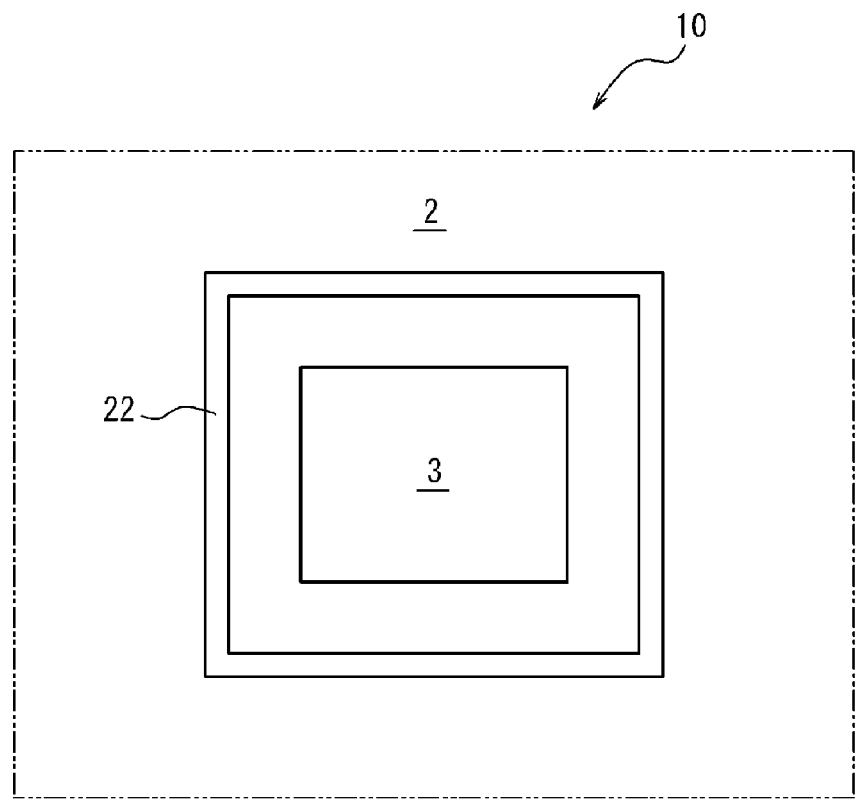
FIG. 7 is a plan view illustrating an example in which the recess is groove-shaped.
Figure 7:
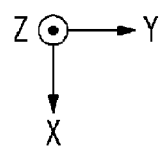

As illustrated in FIG. 7, the recess 22 may be groove-shaped and surround the light emission element 3 in plan view of the element substrate 2. The recess 22 may extend discontinuously instead of extending along the entire periphery of the light emission element 3. For example, the recess 22 may be groove-shaped and extend in one direction, such as the X-axis direction or the Y-axis direction. When the recess 22 is groove-shaped, the wavelength converter 6 can extend into the recess 22 over a larger area. As a result, the wavelength converter 6 can more strongly adhere to the element substrate 2.

Figure 8:
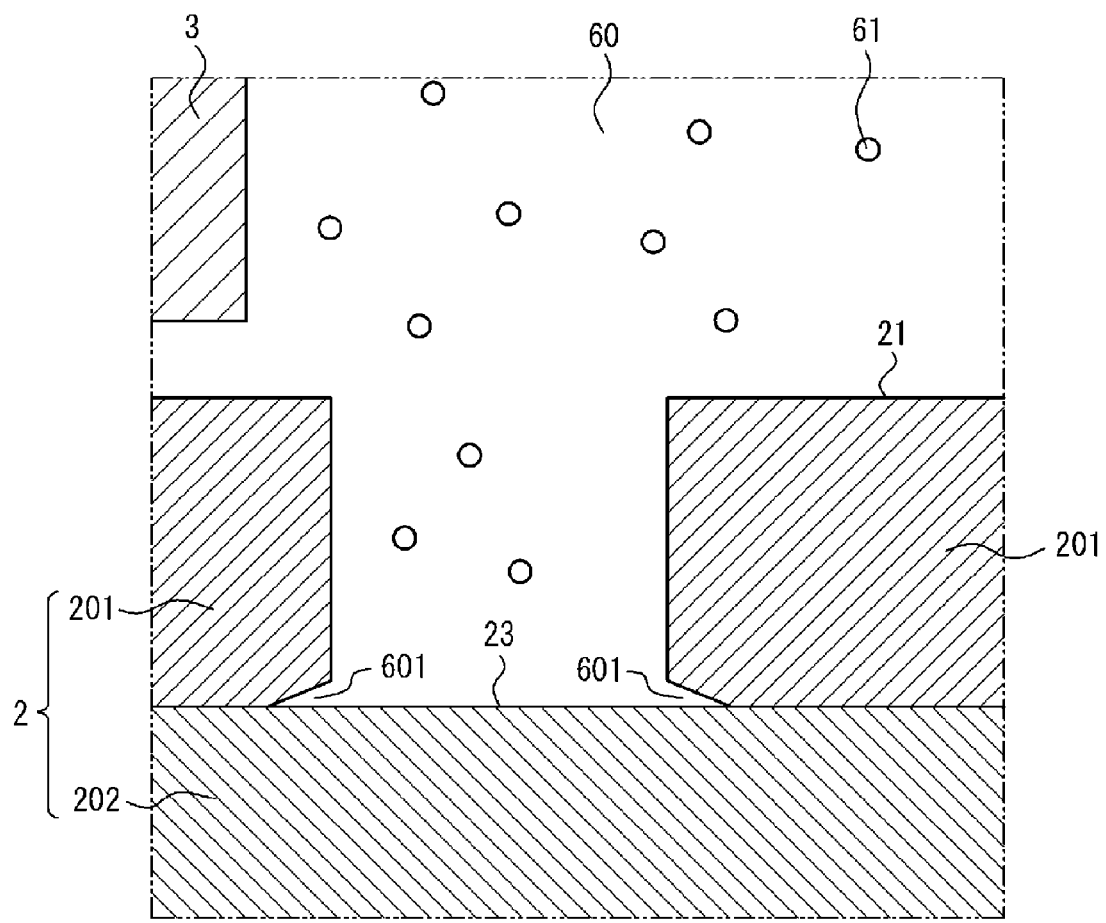
FIG. 8 is a sectional view illustrating an example in which a substrate includes a first layer and a second layer.
Figure 8:
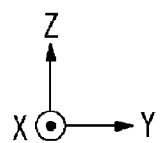

As illustrated in FIG. 8, the element substrate 2 may include at least a first layer 201 and a second layer 202. The number of layers is not limited to two, and may be three or more. In other words, the element substrate 2 may include at least two layers. Assume that the boundary between the first layer 201 and the second layer 202 is exposed in the space in the recess 22. The boundary between the first layer 201 and the second layer 202 may include small gaps. The light-transmissive member 60 extending into the recess 22 may include intrusive portions 601 extending into the gaps at the boundary between the first layer 201 and the second layer 202. In other words, at least a portion of the wavelength converter 6 may extend into a space between adjacent ones of the layers of the element substrate 2. When the light-transmissive member 60 includes the intrusive portions 601, the wavelength converter 6 including the light-transmissive member 60 is not easily removed from the element substrate 2 including the recess 22. In other words, the wavelength converter 6 can more strongly adhere to the element substrate 2.

The light emission device 10 emits the illumination light toward a region above (in the positive Z-axis direction from) the wavelength converter 6 on the first surface 21 of the element substrate 2. The light emission device 10 may emit the illumination light sideways (in the X-axis direction or Y-axis direction) from the wavelength converter 6. Thus, light can be more efficiently emitted.

The light emission device 10 may be obtained by forming two or more light emission devices 10 on the element substrate 2 and then separating the light emission devices 10 from each other by dicing the element substrate 2. Alternatively, the light emission device 10 may be obtained by mounting a plurality of light emission elements 3 on the element substrate 2, placing or applying the wavelength converter 6, and then separating the light emission devices 10 from each other. The element substrate 2 may be divided such that one light emission device 10 includes one light emission element 3, or such that one light emission device 10 includes two or more light emission elements 3.

Figure 9:
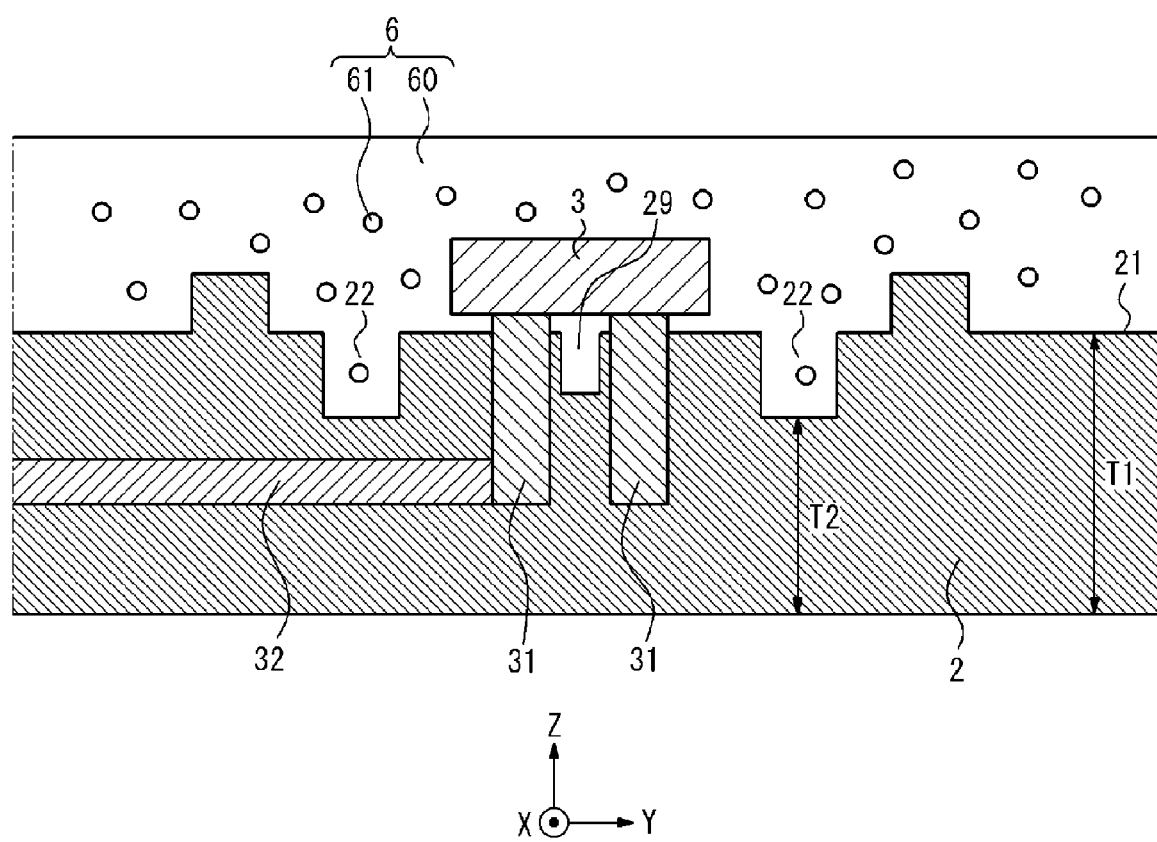
FIG. 9 is a sectional view illustrating an example in which a second recess is positioned below a light emission element, the second recess being shallower than the recess.
Figure 10:
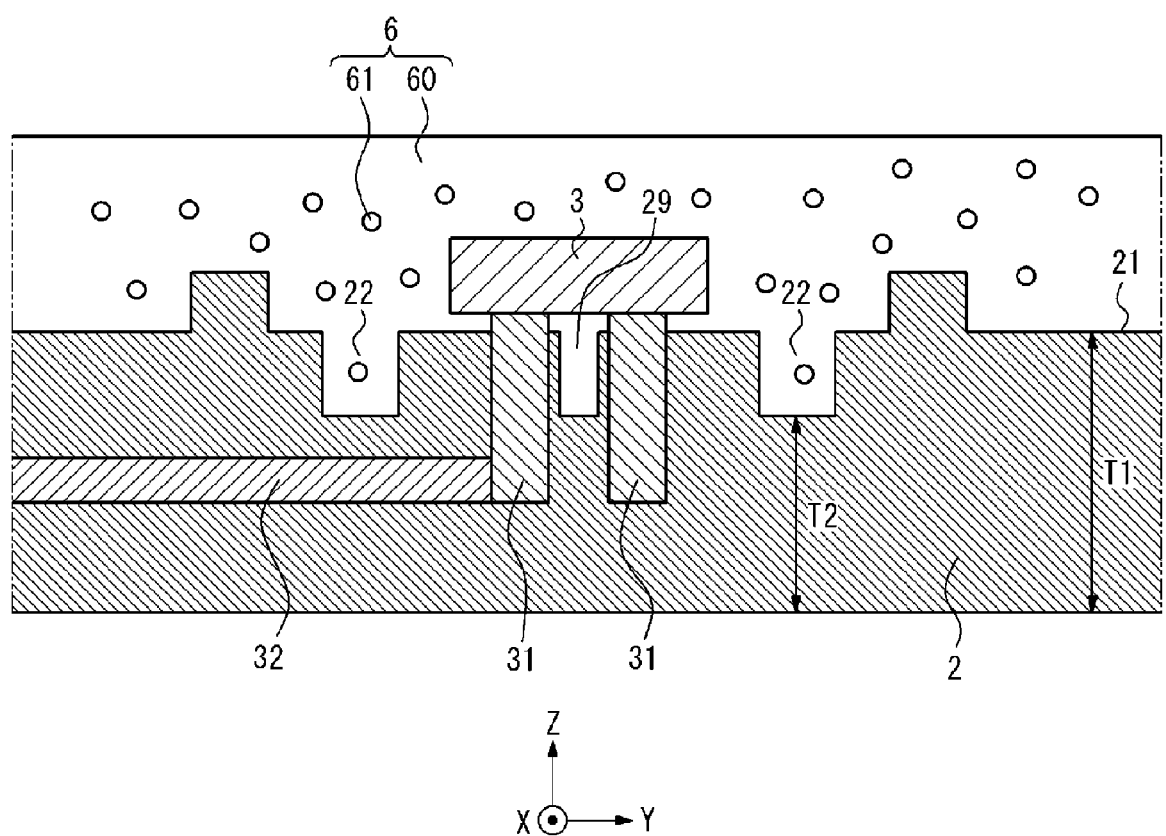
FIG. 10 is a sectional view illustrating an example in which a second recess is positioned below the light emission element, the second recess having the same depth as the depth of the recess.
Figure 11:
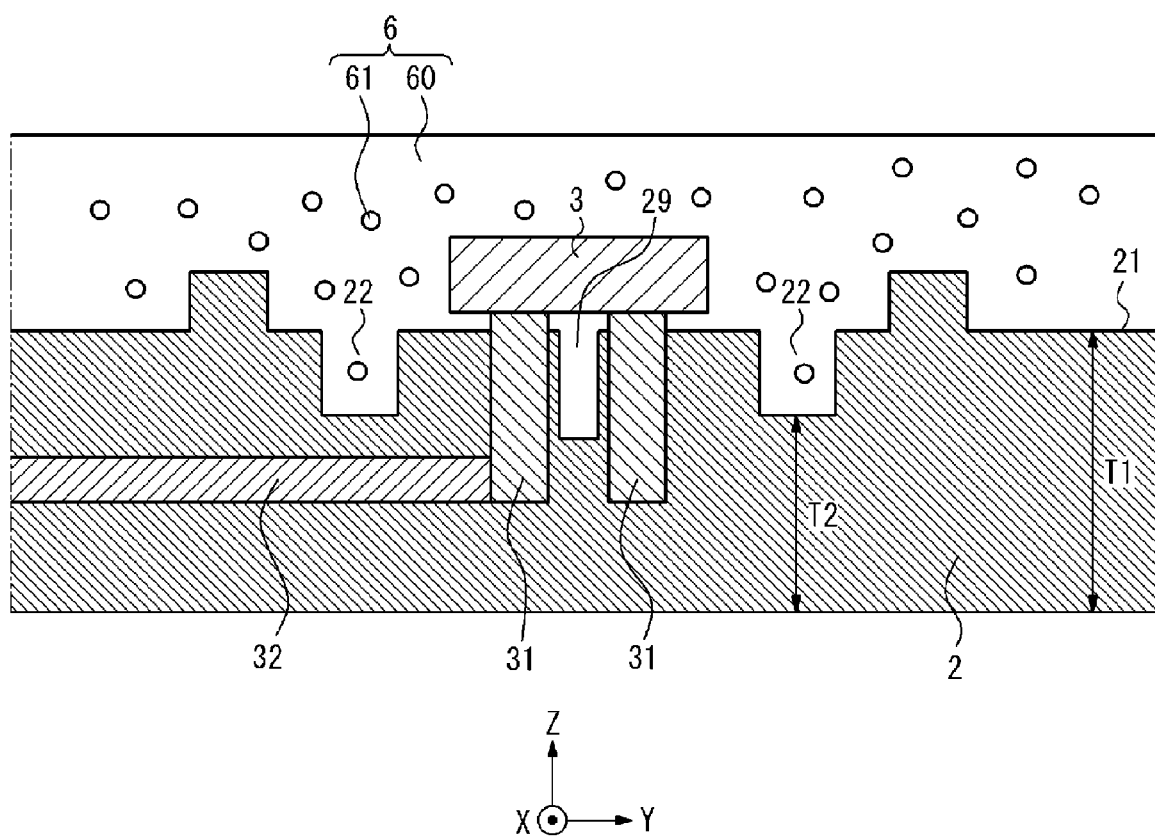
FIG. 11 is a sectional view illustrating an example of in which a second recess is positioned below the light emission element, the second recess being deeper than the recess.

As illustrated in FIGS. 9, 10, and 11, the first surface 21 of the element substrate 2 may further include a second recess 29. The second recess 29 is positioned below the light emission element 3. In other words, the second recess 29 is positioned to overlap the light emission element 3 in plan view of the first surface 21. The second recess 29 may have a depth less than the depth of the recess 22 positioned not to overlap the light emission element 3 as illustrated in FIG. 9, equal to the depth of the recess 22 as illustrated in FIG. 10, or greater than the depth of the recess 22 as illustrated in FIG. 11. When the second recess 29 is provided, the wavelength converter 6 can extend into the second recess 29 below the light emission element 3. Therefore, the wavelength converter 6 serves as a joining material for joining the light emission element 3 and the element substrate 2 to each other and increases the bonding strength between the light emission element 3 and the element substrate 2. When the depth of the second recess 29 is equal to the depth of the recess 22, the recesses do not receive uneven stress upon application of heat to the wavelength converter 6 and other components, and cracks or the like are not easily formed in the element substrate 2. When the depth of the second recess 29 is greater than the depth of the recess 22, a larger amount of joining material is provided at a location overlapping the light emission element 3, and the bonding strength can be increased accordingly. When the depth of the second recess 29 is less than the depth of the recess 22, the bonding strength can be increased, and the bonding strength can be increased with less possibility of deformation of the substrate compared to when the depth is large. Accordingly, the light emission element 3 can be stably mounted.

Example of Structure of Illumination Apparatus 100

As illustrated in FIG. 12, in one embodiment, an illumination apparatus 100 includes at least one light emission device 10 and emits light emitted from the light emission device 10 as illumination light. When the illumination apparatus 100 includes a plurality of light emission devices 10, the illumination apparatus 100 may control the intensities of light emitted from the light emission devices 10 individually or in association with each other. The spectra of light emitted from the light emission devices 10 may be the same or differ from each other. The illumination apparatus 100 may control the intensities of light emitted from the light emission devices 10 in association with each other to control the spectrum of light obtained by combining light emitted from the light emission devices 10. The light obtained by combining light emitted from the light emission devices 10 is also referred to as combined light. The illumination apparatus 100 may emit the combined light as the illumination light. The illumination apparatus 100 may select at least one or more of the light emission devices 10 and cause the selected light emission devices 10 to emit illumination light.

The illumination apparatus 100 may further include a mount board 110 on which the light emission devices 10 are mounted. The illumination apparatus 100 may further include a housing 120 and a pair of end plates 130. The housing 120 includes a groove-shaped portion in which the mount board 110 is placed. The end plates 130 cover end portions at short sides of the housing 120. The number of light emission devices 10 mounted on the mount board 110 may be one or two or more. The light emission devices 10 may be arranged on the mount board 110 in one line, or in a grid pattern or a staggered pattern. The arrangement of the light emission devices 10 is not limited to these examples. The light emission devices 10 may be mounted on the mount board 110 in various types of arrangements.

The mount board 110 may include a circuit board including a wiring pattern. The circuit board may include, for example, a printed board, such as a rigid board, a flexible board, or a rigid-flexible board. The circuit board may include a drive circuit that controls the light emission device 10.

The mount board 110 functions to dissipate heat emitted by the light emission devices 10 to the outside. The mount board 110 may be made of, for example, a metal material, such as aluminum, copper, or stainless steel, an organic resin material, or a composite material containing these materials.

The mount board 110 may have an elongated rectangular shape in plan view. The shape of the mount board 110 is not limited to this, and may be various other shapes.

The illumination apparatus 100 may further include a lid portion 140 for enclosing the mount board 110 and the light emission device 10 disposed in the housing 120. The lid portion 140 may be made of a light-transmissive material to allow transmission of the illumination light emitted from the light emission devices 10 to the outside of the illumination apparatus 100. The lid portion 140 may be made of, for example, a resin material, such as acrylic resin, or glass. The lid portion 140 may have an elongated rectangular shape in plan view. The shape of the lid portion 140 is not limited to this, and may be various other shapes. The illumination apparatus 100 may further include a sealing member provided between the lid portion 140 and the housing 120. In this case, water, dust, or the like does not easily enter the housing 120. As a result, the illumination apparatus 100 has improved reliability irrespective of the environment in which the illumination apparatus 100 is installed. The illumination apparatus 100 may further include an absorbent in the housing 120.

The drawings illustrating the embodiments of the present disclosure are schematic. In the drawings, dimensional ratios or the like may differ from the actual ones.

Although embodiments of the present disclosure have been described based on the drawings and examples, the present disclosure is not limited to the above-described embodiments. Note that various modifications or alterations are possible by those skilled in the art based on the present disclosure. Therefore, note that those modifications or alterations are included in the scope of the present disclosure. For example, functions or the like included in each component or the like may be rearranged without any logical inconsistencies, and a plurality of component or the like may be combined together or divided. Other changes are also possible without departing from the spirit of the present disclosure.

In the present disclosure, terms such as "first" and "second" are identifiers for distinguishing components. In the present disclosure, the numbers of components distinguished by the terms such as "first" and "second" may be interchanged with each other. For example, the identifier "first" of the first surface 21 and the identifier "second" of the second surface 23 may be interchanged with each other. The identifiers are interchanged simultaneously. The components are distinguishable even after their identifiers are interchanged. The identifiers may be omitted. Components whose identifiers are omitted are distinguished by reference signs. In the present disclosure, description of identifiers such as "first" and "second" alone is not to be used for interpretation of the order of components or as basis for assuming that identifiers of smaller numbers are present.

In the present disclosure, the X axis, the Y axis, and the Z axis are provided for convenience of description, and are interchangeable. Components of the present disclosure have been described by using the orthogonal coordinate system including the X axis, the Y axis, and the Z axis. Positional relationships between the components of the present disclosure are not limited to orthogonal relationships.

The invention claimed is:

1. A light emission device comprising:
a substrate having a first surface;
a light emission element mounted on the first surface, the light emission element emitting excitation light;
a reflective film covering at least a portion of the first surface; and
a wavelength converter positioned on at least a portion of the first surface and the light emission element, the wavelength converter converting the excitation light into illumination light,
wherein the substrate comprises at least one of:
a recess having a second surface and a third surface, the second surface being positioned below the first surface, the third surface connecting the second surface and the first surface to each other; or
a projection projecting upward from the first surface,
wherein, when the substrate comprises the recess, the wavelength converter is in contact with at least a portion of the second surface without the reflective film being disposed between the wavelength converter and the portion of the second surface, and
wherein the wavelength converter is in contact with at least one of:
at least a portion of the second surface; or
at least a portion of the projection.

2. A light emission device comprising:
a substrate having a first surface;
a light emission element mounted on the first surface, the light emission element emitting excitation light;
a reflective film covering at least a portion of the first surface; and
a wavelength converter positioned on at least a portion of the first surface and the light emission element, the wavelength converter converting the excitation light into illumination light,
wherein the substrate comprises at least one of:
a recess having a second surface and a third surface, the second surface being positioned below the first surface, the third surface connecting the second surface and the first surface to each other; or
a projection projecting upward from the first surface,
wherein, when the substrate comprises the recess, the wavelength converter is in contact with at least a portion of the second surface without the reflective film being disposed between the wavelength converter and the portion of the second surface,
wherein the wavelength converter is in contact with at least one of:
at least a portion of the second surface; or
at least a portion of the projection, and
wherein the reflective film covers at least a portion of the third surface.

3. The light emission device according to claim 1, wherein a height of the projection from the first surface is less than a depth of the recess from the first surface.

4. The light emission device according to claim 1, wherein a depth of the recess from the first surface is less than a thickness of the substrate at the second surface.

5. The light emission device according to claim 1, wherein the recess is groove-shaped and surrounds the light emission element.

6. The light emission device according to claim 1, wherein an area of the second surface is greater than an area of an opening of the recess.

7. The light emission device according to claim 6, wherein an angle between the second surface and the third surface is acute.

8. The light emission device according to claim 1, wherein an angle between the third surface of the recess at a side far from the light emission element and the second surface is obtuse.

9. The light emission device according to claim 1, wherein the substrate comprises at least two layers, and wherein at least a portion of the wavelength converter extends into a space between adjacent ones of the layers of the substrate.

10. The light emission device according to claim 1, wherein the substrate comprises the recess and the projection.

11. The light emission device according to claim 10, wherein the projection is positioned farther from the light emission element than the recess.

12. An illumination apparatus comprising:
the light emission device according to claim 1; and
a mount board, wherein the light emission device is mounted on the mount board.

* * * * *